United States Patent
McEachern et al.

(10) Patent No.: US 7,511,468 B2
(45) Date of Patent: Mar. 31, 2009

(54) HARMONICS MEASUREMENT INSTRUMENT WITH IN-SITU CALIBRATION

(76) Inventors: Alexander McEachern, 6067 Rockridge Blvd., Oakland, CA (US) 94618; Matthew Muh, 2330 Haste St., #306, Berkeley, CA (US) 94704

( * ) Notice: Subject to any disclaimer, the term of this patent is extended or adjusted under 35 U.S.C. 154(b) by 0 days.

(21) Appl. No.: 11/603,227

(22) Filed: Nov. 20, 2006

(65) Prior Publication Data

US 2008/0116880 A1   May 22, 2008

(51) Int. Cl.
*G01R 11/32* (2006.01)
*G01D 18/00* (2006.01)

(52) U.S. Cl. .......................... 324/74; 702/85

(58) Field of Classification Search ............... 324/142, 324/99 D, 103 R, 115–116, 555, 74; 702/60, 702/85
See application file for complete search history.

(56) References Cited

U.S. PATENT DOCUMENTS

| | | | | |
|---|---|---|---|---|
| 4,514,686 A * | 4/1985 | Mayfield | ..................... | 324/142 |
| 4,667,152 A * | 5/1987 | Hayes et al. | ............. | 324/76.24 |
| 4,672,555 A * | 6/1987 | Hart et al. | .................... | 700/276 |
| 4,791,362 A * | 12/1988 | Philpot | ........................ | 324/142 |
| 4,949,029 A | 8/1990 | Cooper et al. | ................ | 324/74 |
| 5,014,229 A | 5/1991 | McEachern | ................ | 702/106 |
| 5,017,860 A | 5/1991 | Germer et al. | ............... | 324/142 |
| 5,231,347 A | 7/1993 | Voisine et al. | ................ | 324/142 |
| 5,325,048 A | 6/1994 | Longini | ........................ | 324/74 |
| 5,446,389 A * | 8/1995 | Lenz | ........................... | 324/555 |
| 5,495,167 A | 2/1996 | Cotroneo | ..................... | 324/74 |
| 5,563,506 A | 10/1996 | Fielden et al. | .............. | 324/142 |
| 5,706,214 A | 1/1998 | Putt et al. | .................... | 700/286 |
| 5,736,847 A * | 4/1998 | Van Doorn et al. | .......... | 324/142 |
| 5,808,902 A * | 9/1998 | Levert et al. | ................. | 700/293 |
| 6,084,394 A | 7/2000 | Windsheimer et al. | ...... | 324/130 |
| 6,204,647 B1 * | 3/2001 | Niemann et al. | ............ | 323/282 |
| 6,377,037 B1 | 4/2002 | Burns et al. | .................. | 324/142 |
| 6,397,155 B1 * | 5/2002 | Przydatek et al. | ............. | 702/61 |
| 6,429,637 B1 | 8/2002 | Gandhi | ........................ | 324/74 |
| 6,618,684 B1 | 9/2003 | Beroset et al. | ................. | 702/99 |
| 6,639,413 B2 | 10/2003 | Whitehead et al. | ........... | 324/601 |
| 6,735,535 B1 | 5/2004 | Kagan et al. | ................... | 702/61 |
| 6,815,942 B2 | 11/2004 | Randall et al. | ............... | 324/142 |
| 6,892,144 B2 | 5/2005 | Slater et al. | .................... | 702/61 |
| 6,911,813 B2 | 6/2005 | Gandhi | ........................ | 324/142 |

* cited by examiner

*Primary Examiner*—Ha Tran T Nguyen
*Assistant Examiner*—Joshua Benitez

(57) ABSTRACT

A portable harmonics measurement instrument performs in-situ self-calibration of its current transducers and their associated measurement channels and of its voltage probes and their associated measurement channels. In-situ self-calibration is performed immediately before making a measurement on the alternating current power distribution grid. In-situ self-calibration is performed by means of a built-in voltage reference source and a built-in current reference source, which generate highly-accurate voltage and current calibration waveforms with harmonic components.

4 Claims, 4 Drawing Sheets

HARMONICS MEASUREMENT INSTRUMENT WITH IN-SITU CALIBRATION

CROSS REFERENCES TO RELATED APPLICATIONS

None.

BACKGROUND

1. Field of Invention

This invention relates to electronic measurement equipment, more specifically to portable equipment for making in-situ harmonic voltage measurements and harmonic current measurements on alternating current (AC) power conductors. The equipment performs an in-situ calibration of its measurement channels, including their associated current transducers, immediately before making an in-situ measurement.

2. Background of the Invention

Voltages and currents on electric power distribution grids generally operate at 50 Hertz or 60 Hertz. This frequency is called the fundamental frequency. In an ideal grid, the voltages and currents will be perfectly sinusoidal with respect to time. However, in real grids, the voltages and currents are distorted, and contain both a fundamental frequency component and numerous smaller harmonic components. The harmonic components are typically caused by nonlinear loads at commercial or industrial sites.

It is useful to determine the direction of harmonic propagation on electric power distribution grids. Knowing the direction of harmonic propagation may allow utility companies to detect the contribution of a particular user to harmonic distortion.

Typically, harmonic direction finding algorithms rely, at least in part, upon an accurate measurement of the phase angle between a voltage harmonic waveform and current harmonic waveform.

The inductive nature of typical power distribution systems means that this phase angle is often close to 90 degrees, so even a small error in measuring this parameter can lead to an apparent reversal of the direction of harmonic power flow, because the direction of flow reverses when the angle reaches 90 degrees. For example, if the phase angle is 89.5 degrees, the direction of harmonic power flow is in one direction; if the phase angle is 90.5 degrees, the direction of harmonic power flow is in the opposite direction. For this reason, an error of just one degree can lead to exactly the wrong conclusion about the direction of harmonic power flow.

Furthermore, a phase angle error of just 0.5 degrees at the fundamental frequency, caused by phase delay, translates mathematically to a much worse phase angle error of 24.5 degrees at the $49^{th}$ harmonic, for example.

For these reasons, it is important to measure harmonic phase angles accurately.

A significant source of phase angle measurement error, as well as ratio error, comes from the split-core, clamp-on current transducers commonly used to measure in-situ current waveforms.

Clamp-on transducers are often required for practical in-situ measurements using portable instruments, because this type of current transformer does not require disconnecting or shutting down the load being measured. However, as known to those familiar with the art, this type of sensor introduces phase angle and ratio errors.

Some of these current transducer errors are constant for a given transducer, and can be calibrated at a factory or a laboratory. For example, some of the sources of ratio errors and phase errors associated with a particular current transducer can be calibrated at a factory or laboratory. An example of such a laboratory calibration was disclosed by McEachern (the first-named inventor in the present application) in U.S. Pat. No. 5,014,229.

However, other current transducer errors are a function of quantities that vary with time and location, such as temperature, humidity, the amount of corrosion on the mating surfaces of the magnetic core, the amount of mechanical wear on the hinge of the jaws, the smoothness of the mating surfaces of the magnetic core, and the spring pressure holding the jaws closed.

These transducer errors cannot be calibrated at a factory or laboratory, because they vary with time and location.

Additional errors are introduced in the harmonic measurements by the chain of electronics between the current transducer and the measurement results: amplifiers, filters, analog-to-digital converters, and the like.

Again, some of the errors in this chain of electronics can be calibrated at a factory or laboratory. The parts that are stable over time of the overall gain, offset, amplitude response, and phase response, for example, might be calibrated at a factory or laboratory.

However, some errors in this chain of electronics vary with temperature, humidity, time, ambient magnetic field, and other local parameters which may be known or unknown. These errors cannot be calibrated at a factory or laboratory.

As is familiar to one familiar with the state of the art, similar errors arise in the chain of electronics needed for voltage harmonic measurements.

For these reasons, to make precise in-situ measurements of harmonic voltages and harmonic currents, and the phase angles between harmonic voltages and currents, it is necessary to calibrate the entire measurement voltage and current channels, including the current transducers, immediately before making measurements. It is necessary to perform in-situ calibration of the current transducers at the actual measurement site, as the temperature and humidity may be different from those at a prior site and as the amount of corrosion on the mating surfaces of the magnetic core, and the amount of mechanical wear on the hinge of the jaws may have changed since calibration at the previous site, or at the initial calibration lab.

Harmonic voltage and current measuring instruments known in the art often have several channels of measurements. For example, a typical instrument may have three current channels of measurement, one for each phase on a three-phase AC power grid, plus four voltage channels of measurements, one for each phase-to-neutral voltage on a three-phase AC power grid and one for the neutral-to-ground voltage on the grid.

To maximize accuracy and minimize errors of all types, measurement channels known in the art are constructed from highly stable electronic components. As is well known in the art, components that affect the amplitude and phase response of measurement channels, such as resistors and capacitors, have values that vary with age, temperature, humidity, and other influencing factors. Selecting and purchasing components that are stable with respect to age, temperature, and humidity is difficult and expensive.

Different approaches have been taken in the art to perform calibration of energy meters or power monitoring systems, which are affected by similar sources of error as the harmonics measurement instrument. For example, Burns et al. in U.S. Pat. No. 6,377,037 disclose a meter with a power factor compensation technique that inserts a delay into the sampled current or voltage stream; however, Burns et al. do not disclose in-situ calibration for field measurements, and therefore cannot compensate for variations in sensors and amplifiers that would have developed since the instrument's most recent laboratory calibration.

Also, Gandhi in U.S. Pat. No. 6,911,813 discloses an electronic meter that delays the digital voltage and/or current signal to compensate for phase shift error; but Gandhi does not disclose in-situ calibration for field measurements, and therefore cannot compensate for variations in sensors and amplifiers that would have developed since the meter's most recent laboratory calibration.

Voisine et al. in U.S. Pat. No. 5,231,347 disclose a power meter that adjusts the phase angle between the voltage and current signals by adding a phase lead to the primary coil of the voltage transformer. Although this disclosure recognizes the problem of measuring the phase angle between voltage and current accurately, Voisine et al. do not disclose in-situ calibration for field measurements, and therefore cannot compensate for variations in sensors and amplifiers that would have developed since the power meter's most recent laboratory calibration.

Whitehead et al. in U.S. Pat. No. 6,639,413 takes the approach of including a test unit for applying a test signal to the system and also a phase reference module. However, Whitehead et al. do not disclose in-situ calibration using non-sinusoidal test input signals, i.e., those that contain harmonic content.

Longini in U.S. Pat. No. 5,325,048 utilizes a calibration stand comprising a current and voltage generator for generating standardized current and voltage signals. However, Longini does not disclose a calibration unit that is built into the meter itself and that performs calibration at the site where the power meter will be installed. Furthermore, Longini does not disclose a method to perform phase angle calibration.

In summary, none of these methods disclose in-situ calibration, at harmonic frequencies, of both the amplitude response of the current and voltage measurement circuits, including their associated current transducers and voltage probes, and the phase angle response between them, at the measurement sites immediately before making measurements.

OBJECTS AND ADVANTAGES

It is accordingly an object of this invention to provide a method for making precise measurements of harmonic voltages, harmonic currents, and the phase angles between the harmonic voltages and currents, on an alternating current power system, that corrects both the measurement transducers and their associated electronics for time-varying, location-varying and environment-varying errors.

It is a further object of this invention to minimize the cost of a highly stable and accurate instrument by shifting the requirement for stable and accurate components from multiple measurement channels to a single voltage calibration source and a single current calibration source.

Still further objects and advantages will become apparent from a consideration of the ensuing description and accompanying drawings.

PREFERRED EMBODIMENT

Description

Figure 1:
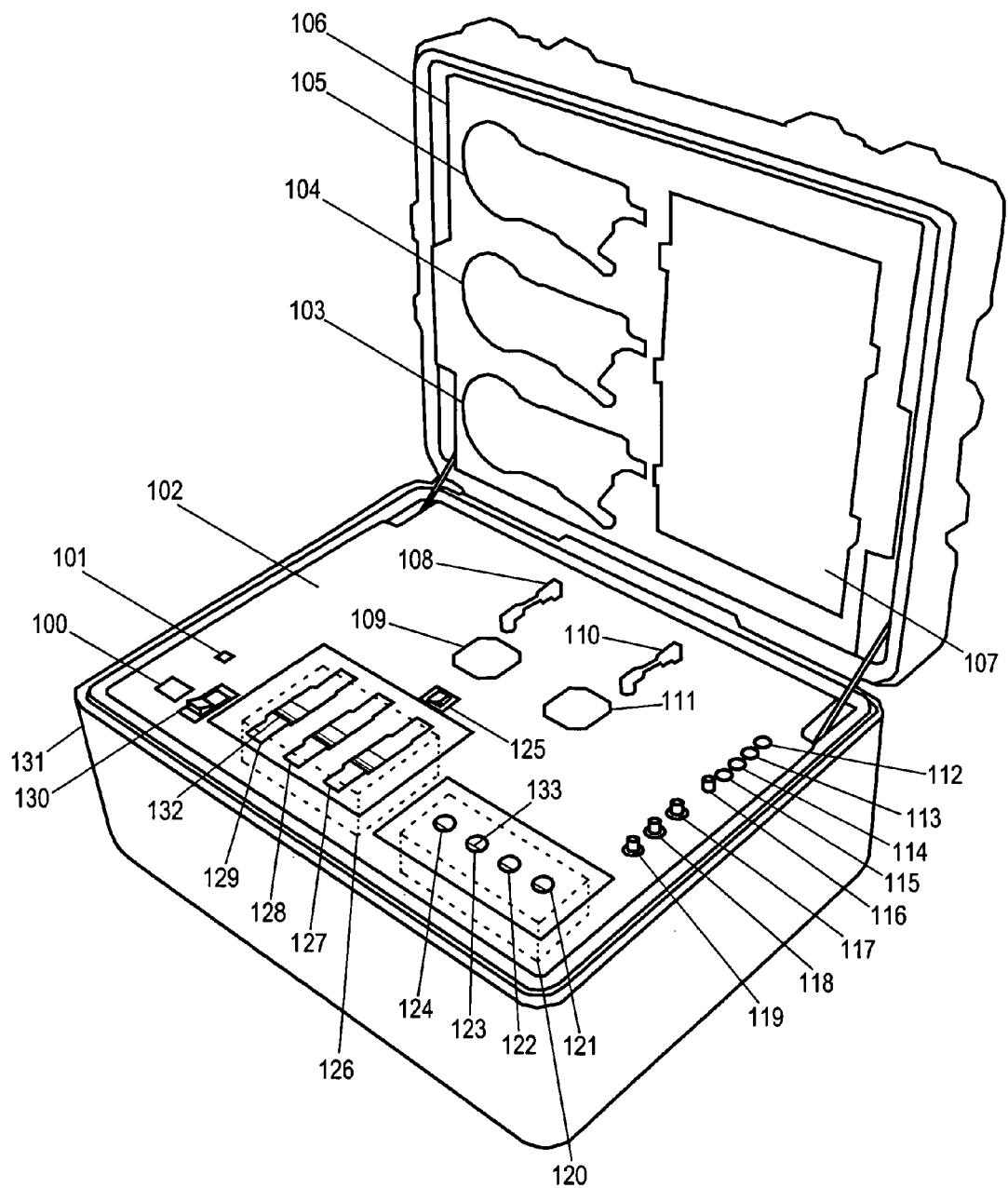
FIG. 1 shows a representative embodiment of the present invention.

Turning first to FIG. 1, we see a representative embodiment of the present invention. The instrument consists of an instrument panel 102 and a storage lid 106 above. The storage lid 106 contains spaces 103,104,105,107 to store the current transducers, voltage probes, and other components when not in use.

Figure 3:
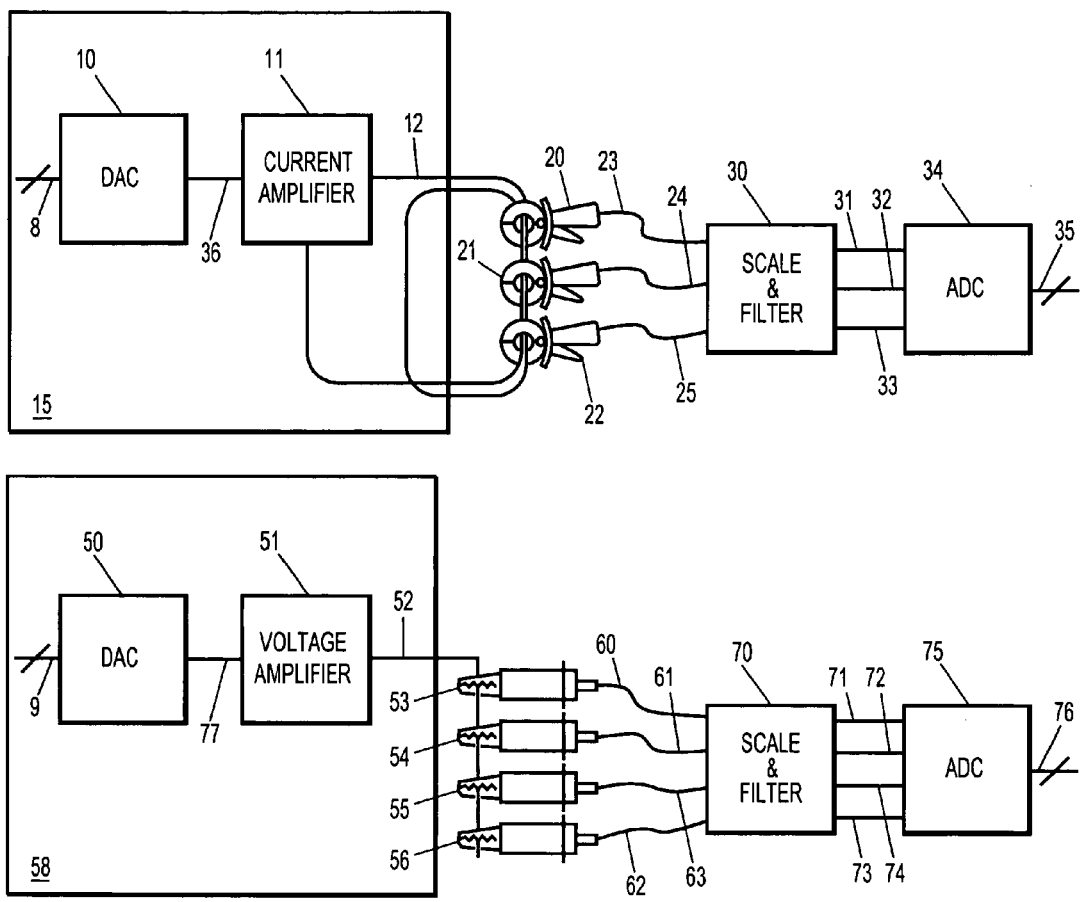
FIG. 3 shows a block diagram of the present invention in in-situ self-calibration mode.

A key element of the present invention is the built-in current calibration source 126, which contains a tube 132 through which the current loops 12, seen in FIG. 3, are wound. This tube 132 is preferably constructed from a material that is magnetically transparent and electrically insulating, such as polycarbonate resin thermoplastic manufactured by the General Electric Company of Fairfield, Conn., under the trademark Lexan. The outside diameter of this tube is preferably selected to mechanically match the inside diameter of the current transducers 20,21,22 shown in FIG. 3. During in-situ calibration, the current transducers 20,21,22 are inserted through slots 127,128,129 to clamp around the tube 132 in the current calibration source 126.

Adjacent to the current calibration source 126 is a range selection switch 125 used to select the number of loops of conductors in the tube 132 in the current calibration source 126.

A voltage calibration source 120 contains a metal rod 133, also seen as a conductor 52 in FIG. 3, which provides a means to attach the voltage probes 53,54,55,56 seen in FIG. 3 to the output of the voltage amplifier 51 during self-calibration. The voltage calibration source 120 contains four holes 121,122,123,124 through which the voltage probes may be inserted to attach to the metal rod 133.

The instrument panel 102 contains a port 101 through which the instrument is connected to a computer on which the user interface software is installed. The instrument panel also contains jacks 112,113,114,115 for the outputs 60,61,62,63 of the voltage probes 53,54,55,56, a ground terminal 116 for the ground lead, and jacks 117,118,119 for the outputs 23,24,25 of the current transducers 20,21,22. An instrument power receptacle 100 and an instrument power switch 130 are also located on the instrument panel 102.

Factory calibration connections 108,110 on the instrument panel 102 permit factory calibration without having to lift the instrument panel 102. The instrument panel 102 contains cutouts 109,111 for the fans used for cooling. The instrument is preferably housed in a rugged utility case 131 to protect the electronic components inside while it is transported to a location for an in-situ measurement.

Figure 2:
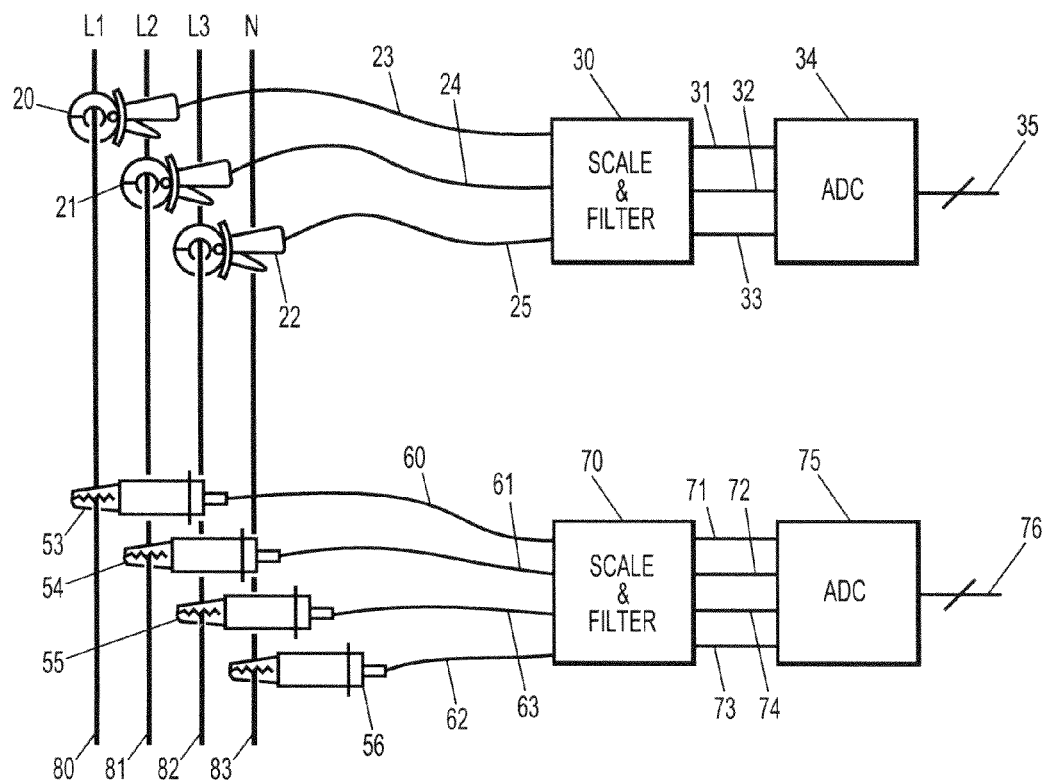
FIG. 2 shows a prior art block diagram of an instrument for making harmonics measurements.

Turning our attention now to FIG. 2, we see the prior art for in-situ measurement of voltage harmonics and current harmonics on an alternating current power grid 80,81,82,83.

Clamp-on current transducers 20,21,22 measure the currents in conductors L1 80, L2 81, and L3 82. The outputs 23,24,25 of the current transducers 20,21,22 are fed to the signal-conditioning block 30. This signal-conditioning block 30 typically adjusts the scale of the signals to match the full-scale of the associated analog-to-digital (ADC) converter 34, and also provides the anti-alias filter that is well known to one familiar with the art. The output 35 of the ADC is sent to a processor or computer for further processing by software. The voltage probes 53,54,55,56 are attached to conductors L1 80, L2 81, L3 82, and in some cases Neutral 83. Their outputs 60,61,62,63 are fed to the signal-conditioning block 70, whose outputs 71,72,73,74 are then fed to the ADC block 75. The output 76 of this ADC is sent to the software.

In the prior art shown in FIG. 2, calibration of the instrument is performed at a factory or laboratory. This prior-art calibration compensates for all of the errors that do not vary with time. However, this prior art does not compensate for errors that are introduced after the instrument leaves the factory or laboratory, such as temperature variations, corrosion and mechanical wear on the current transducers 20,21,22, and other known and unknown errors.

Turning now to FIG. 3, we see a block diagram of the present invention, in its in-situ self-calibration mode. In-situ self-calibration refers to the process of calibrating the current and voltage measurement channels immediately before making in-situ measurements, and at the location and in the conditions under which the in-situ measurements will be made.

In FIG. 3, we see an important element of the present invention: a current calibration source [15] and a voltage calibration source [58] that are constructed inside the portable measuring instrument.

Two digital-to-analog converters 10,50 (DACs) generate highly accurate analog voltage outputs, preferably with a resolution of 16 bits or greater such as the DAC8831 manufactured by Texas Instruments of Dallas, Tex. Software and firmware, the exact configuration of which is not critical to the present invention, cause these DACs 10,50 to produce both sinusoidal and distorted waveforms based on their respective digital inputs 8,9. The analog outputs 36,77 of the DACs 10,50 are fed to the current amplifier 11 and voltage amplifier 51. The current amplifier 11 preferably has a full-scale output of at least +/−10 amps, and an amplitude and phase response that is stable over time, temperature, humidity, and other influencing factors. The voltage amplifier 51 preferably has a full-scale output of at least +/−500 volts, and an amplitude and phase response that is stable over time, temperature, humidity, and other influencing factors. The current amplifier 11 converts its input voltage 36 to a corresponding current output. The current output flows through one or more current conductor loops 12. The number of current conductor loops 12, combined with the output of the current amplifier 11, determines the resulting magnetic field, and thus the effective current measured by the current transducers 20,21,22. During in-situ self-calibration, three current transducers 20,21,22 are clamped around the current loops 12. The outputs 23,24,25 of the current transducers 20,21,22 are fed to a signal-conditioning block 30 which buffers, scales, and filters the outputs 23,24,25. The outputs 31,32,33 of the signal-conditioning block 30 are fed to an ADC block 34, which samples and digitizes the analog signals 31,32,33. The output 35 of the ADC block 34 is sent to software for further processing to extract correction factors for gain versus frequency, and phase angle versus frequency, which are described further in FIG. 4 and FIG. 5.

The voltage amplifier 51 operates in a similar way, amplifying the analog output 77 from its corresponding DAC 50. The output of the voltage amplifier 51 is measured by four voltage probes 53,54,55,56. The outputs 60,61,62,63 of the voltage probes 53,54,55,56 are routed to a signal-conditioning block 70, which performs buffering, filtering, and scaling. The outputs 71,72,73,74 of the signal-conditioning block 70 are fed to an ADC block 75, which samples and digitizes the analog signals 71,72,73,74. The output 76 of the ADC block 75 is sent to the software for further processing, again to extract correction factors for gain versus frequency, and phase angle versus frequency, which are described further in FIG. 4 and FIG. 5.

PREFERRED EMBODIMENT

Operation

Figure 5:
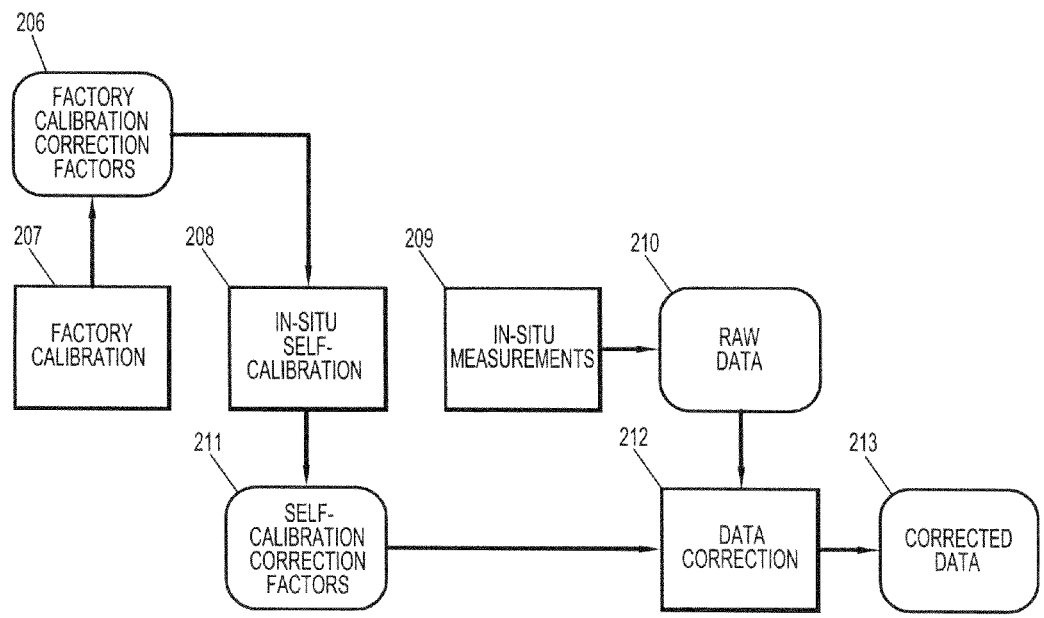
FIG. 5 shows a flow chart of the calibration and measurement process of the present invention.

We now turn our attention to FIG. 5. The present invention relates to in-situ calibration just prior to in-situ measurements. However, prior to performing any in-situ self-calibrations, the current calibration source and voltage calibration source used for in-situ calibration must be calibrated at a factory or laboratory 207. Factory calibration correction factors 206 compensate for non-varying errors in the calibration DACs 10,50 and calibration amplifiers 11,51 in FIG. 3, including DC offset, non-ideal amplitude response, and non-ideal phase angle response; these correction factors 206 may also include compensation for how the amplifiers vary with temperature, humidity, and other influencing quantities. The non-ideal phase angle response is, in the preferred embodiment, the phase angle between a current channel and its associated voltage channel. Factory calibration 207 results in a set of factory calibration correction factors 206.

For reasons that have explained previously in this disclosure, it is necessary to perform in-situ self-calibration 208 in the field just prior to making in-situ measurements 209. This in-situ self-calibration 208 is performed on each voltage probe and current transducer, along with their associated measurement circuits.

First, using software or firmware and the DACs 10,50 and their associated amplifiers 11,51 in FIG. 3, a set of highly accurate voltage and current waveforms is generated and applied to the measurement chains consisting of current sensors and associated circuits, and voltage sensors and associated circuits. These waveforms are highly accurate because the factory calibration correction factors 206 are used to eliminate errors in the DACs 10,50 and their associated amplifiers 11,51 in FIG. 3. These accurate waveforms may consist, for example, of a fundamental frequency sine wave, or a fundamental frequency sine wave and a single harmonic, or any other waveform that is useful for calibrating the current and voltage measurement channels. This set of waveforms is measured by the current and voltage measurement channels. The measurement results are used to calculate a set of self-calibration factors 211 that correct for DC offset, gain response, and phase angle response for this measurement site at the time of the measurement. These self-calibration factors 211 compensate for any errors associated with the build-up of corrosion on the mating surfaces of the core of the current transducers, the mechanical wear of the hinge of the jaws, for temperature, for humidity, and for other known and unknown factors that may influence the measurement. The self-calibration correction factors 211 are stored in memory, using any method known to one familiar with the art, for later use.

After performing self-calibration 208, the instrument is ready to immediately perform in-situ measurements 209. In-situ measurements 209 are performed in a way that is initially identical to the prior art shown in FIG. 2, producing raw in-situ measurement data 210. The stored self-calibration correction factors 211 are then applied 212 to the raw in-situ measurement data 210 to produce a set of corrected data 213. This corrected data 213 is accurate in amplitude and phase angle, and can subsequently be used in harmonic direction-finding algorithms, or for any other purpose that requires accurate amplitude and phase angle measurements of harmonic voltages and currents.

Figure 4:
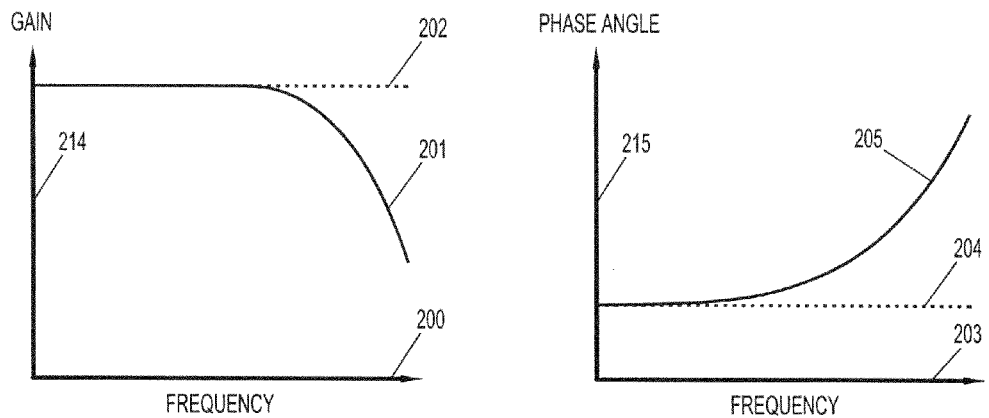
FIG. 4 shows an example of the uncalibrated and calibrated gain response of a measurement channel, and the uncalibrated and calibrated phase angle response between the current and voltage measurement channels.

Turning our attention to FIG. 4, we see an example of the gain response 214 and phase angle response 215 of a single measurement channel, plotted with respect to frequency 200, 203, before and after in-situ self-calibration. The uncalibrated gain 201 found in the raw data 210 declines as frequency increases; after application of the self-calibration correction factors 211, the calibrated gain response 202 is flat as frequency increases. Similarly, the uncalibrated phase angle response 205 found in the raw data 210 increases as frequency increases; after application of the self-calibration correction factors 211, the calibrated phase angle response 204 is flat as frequency increases.

It will be apparent to one familiar with the art that the disclosed method of in-situ self-calibration does not require long-term stability and precision in the components for all of the measurement channels. Instead, it only requires long-term stability and precision in the voltage calibration source and the current calibration source. Errors and drift in the components for the measurement channels are automatically corrected during the in-situ self-calibration. This simpler requirement greatly reduces the cost of precise harmonic measurements on an alternating current power grid, which is a further advantage of the present invention.

OTHER EMBODIMENTS

It will be apparent to one familiar with the art that other useful embodiments of the invention are possible, including but not limited to constructing the current calibration source or the voltage calibration source, or both, as plug-in modules that can be re-calibrated at a laboratory or factory without returning the entire instrument to the laboratory or the factory.

We claim:

1. A portable apparatus for measuring harmonic voltages and currents on an alternating current electric power distribution grid, said alternating current having a fundamental frequency, said apparatus comprising:
   a. a plurality of current measurement channels, each such current measurement channel equipped with an associated current transducer; and
   b. a plurality of voltage measurement channels; and
   c. a current calibration source, said current calibration source having an output, and said current calibration source configured to provide a means of calibrating the current measurement channels and their associated current transducers for gain and phase, at frequencies higher than the fundamental frequency; and
   d. a voltage calibration source, said voltage source having an output, and said voltage calibration source configured to provide a means of calibrating the voltage measurement channels for gain and phase, at frequencies higher than the fundamental frequency; and
   e. said current calibration source and said voltage calibration source configured so that the current calibration source output and the voltage calibration source output are physically separated, and
   f. said current calibration source and said voltage calibration source constructed as a physically embedded element of the portable apparatus.

2. The portable apparatus of claim 1, in which the current calibration source is physically integrated as a plug-in module.

3. The portable apparatus of claim 1, in which the voltage calibration source is physically integrated as a plug-in module.

4. A method for in-situ calibration of a portable measurement instrument for measuring voltages and currents on an alternating current power grid, said alternating current power grid having a fundamental frequency, and said instrument equipped with a plurality of current transducers with associated current measurement channels and a plurality of voltage probes with associated voltage measurement channels, said method comprising:
   a. a method to generate a plurality of calibration currents and calibration voltages at a location near where measurements will be made, said calibration currents and calibration voltages having at least one frequency component higher than the fundamental frequency, and said method to generate the plurality of calibration currents and calibration voltages configured so that the calibration currents are physically separated from the calibration voltages; and
   b. a method for the current transducers and their associated current measurement channels, and voltage probes and their associated voltage measurement channels, to make in-situ measurements of the calibration currents and calibration voltages; and
   c. a calibration method for using the in-situ measurements of the calibration currents and calibration voltages to adjust for invariant and time-varying and location-varying sources of gain error and phase error in the current transducers and their associated current measurement channels, and in the voltage probes and their associated voltage measurement channels.

* * * * *